United States Patent

Davis et al.

(10) Patent No.: US 6,625,034 B2
(45) Date of Patent: Sep. 23, 2003

(54) PIVOTING PRESSURE COVER

(75) Inventors: David R. Davis, Jefferson, SD (US);
Cesar D. Castillo, El Paso, TX (US);
Armando Rocha, Canutillo, TX (US);
Richard A. Gibson, El Paso, TX (US);
Thomas H. Carson, South Sioux City, NE (US); Vernon D. Erickson, Dakota Dunes, SD (US)

(73) Assignee: Gateway, Inc., Poway, CA (US)

( * ) Notice: Subject to any disclaimer, the term of this patent is extended or adjusted under 35 U.S.C. 154(b) by 0 days.

(21) Appl. No.: 10/002,046

(22) Filed: Nov. 15, 2001

(65) Prior Publication Data

US 2003/0090881 A1 May 15, 2003

(51) Int. Cl.[7] ................................................. H05K 5/00
(52) U.S. Cl. ........................................ 361/759; 361/801
(58) Field of Search ............................... 361/752, 753, 361/759, 740, 801, 802, 686

(56) References Cited

U.S. PATENT DOCUMENTS

| 5,544,006 A | | 8/1996 | Radloff et al. |
| 5,640,309 A | * | 6/1997 | Carney et al. ............. 211/41.1 |
| 5,673,175 A | * | 9/1997 | Carney et al. ............. 292/202 |
| 5,748,453 A | | 5/1998 | Carney et al. |
| 5,757,618 A | | 5/1998 | Lee |
| 5,822,196 A | | 10/1998 | Hastings et al. |
| 5,890,693 A | | 4/1999 | Do et al. |
| 6,017,004 A | | 1/2000 | Grantham |
| 6,157,540 A | * | 12/2000 | Eddings et al. ............. 29/521 |
| 6,185,110 B1 | | 2/2001 | Liu |
| 6,215,668 B1 | * | 4/2001 | Hass et al. ............. 24/553 |
| 6,442,038 B1 | * | 8/2002 | Erickson et al. ......... 211/41.17 |

* cited by examiner

Primary Examiner—David Martin
Assistant Examiner—Thanh S. Phan
(74) Attorney, Agent, or Firm—Scott Charles Richardson; Suiter-West

(57) ABSTRACT

The present invention is directed to an apparatus for securing a received tab included on a printed circuit board. The apparatus may include a chassis suitable for containing an electrical component, a card retention member disposed on the external surface of the chassis and a securing member pivotally attached to the card retention member. Additionally, the apparatus may contain a locking system for restraining the securing member in a secured orientation and an angled receiving area on the securing member suitable for forcing the received tab inward towards the chassis.

30 Claims, 2 Drawing Sheets

PIVOTING PRESSURE COVER

FIELD OF THE INVENTION

The present invention generally relates to the field of electronics, and particularly to a pivoting cover for utilization in securing a printed circuit board (PCB) in a chassis.

BACKGROUND OF THE INVENTION

Presently, information handling systems are provided with connectors for integrating printed circuit boards (PCB) into information handling system. Often manufactures of information handling systems include various printed circuit boards with the system depending on the consumer's requirements. When manufactured information handling systems are typically integrated with PCBs matching the consumer's desired configuration and tested prior to shipping. During shipping the information handling system may be subject to rough handling. As a result of rough handling, the consumer may have trouble setting up the information handling system due to PCBs having come loose during shipping, bad connections and the like. Moreover, in certain situations the retention systems utilized to secure the PCB to the information system's case fail resulting the possible loss of critical parts, and even the dislodging of the PCB.

Additionally information handling systems are routinely provided with an excess of connectors to allow the consumer to install additional PCBs into the system. Consumers often may want to include an additional PCB to provide a capability over what was originally manufactured. Drawbacks to consumers installing additional PCBs include difficulty with the retention systems designed to hold the PCB in place. Typically, PCB retention systems are designed to conserve space and therefore are small and may contain parts that may be easily lost. An additional problem with current PCB retention systems are that they fail to ensure the PCB mates properly with the connector on the motherboard of the information handling system. Failing to properly secure the PCB to the electronic components of the information handling system and to the chassis of the information handling system may result in diminished performance, intermittent connection problems and physical damage should the PCB be jarred loose.

Therefore, it would be desirable to provide an apparatus capable of efficiently securing the various PCBs into the information handling system while allowing for easy removal and placement of additional PCBs

SUMMARY OF THE INVENTION

Accordingly, the present invention is directed to an apparatus capable of securing a PCB from vibrations and shocks associated with shipping and rough operating environments. Additionally, the present invention allows for ease of installation and secure connection of the PCB with other electrical components.

In a first embodiment an apparatus includes a chassis suitable for containing an electrical component, a card retention member disposed on the external surface of the chassis, and a securing member pivotally attached to the card retention member, wherein the securing member is capable of obtaining a release orientation and a securing orientation.

In a second embodiment, an apparatus includes a locking system suitable for restraining a pivotally attached securing member to a card retention member from obtaining a releasing orientation, and a chassis suitable for containing an electronic component. The locking system effectively maintaining the sandwiching of a received tab included on a PCB between the securing member and the receiving member.

In a further embodiment, an apparatus contains a chassis, a card retention member disposed on the external surface of the chassis and a securing member pivotally attached to the card retention member wherein the securing member includes an angled receiving area suitable for forcing a received tab included on a PCB inwardly towards the chassis.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
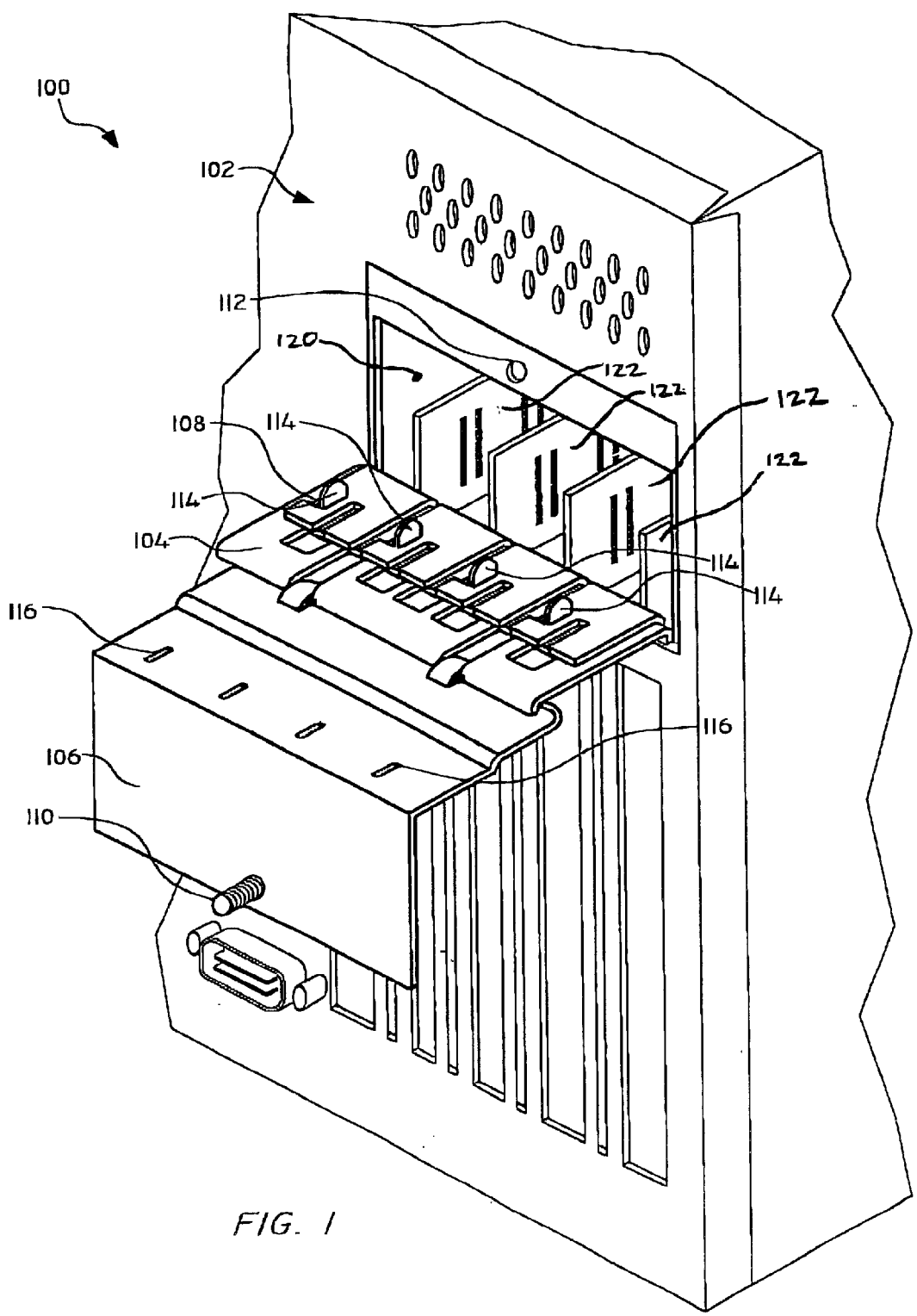
FIG. 1 is a perspective illustration of an exemplary embodiment wherein an apparatus suitable for receiving a tab included on a printed circuit board (PCB) includes a securing member in a receiving orientation.
Figure 3:
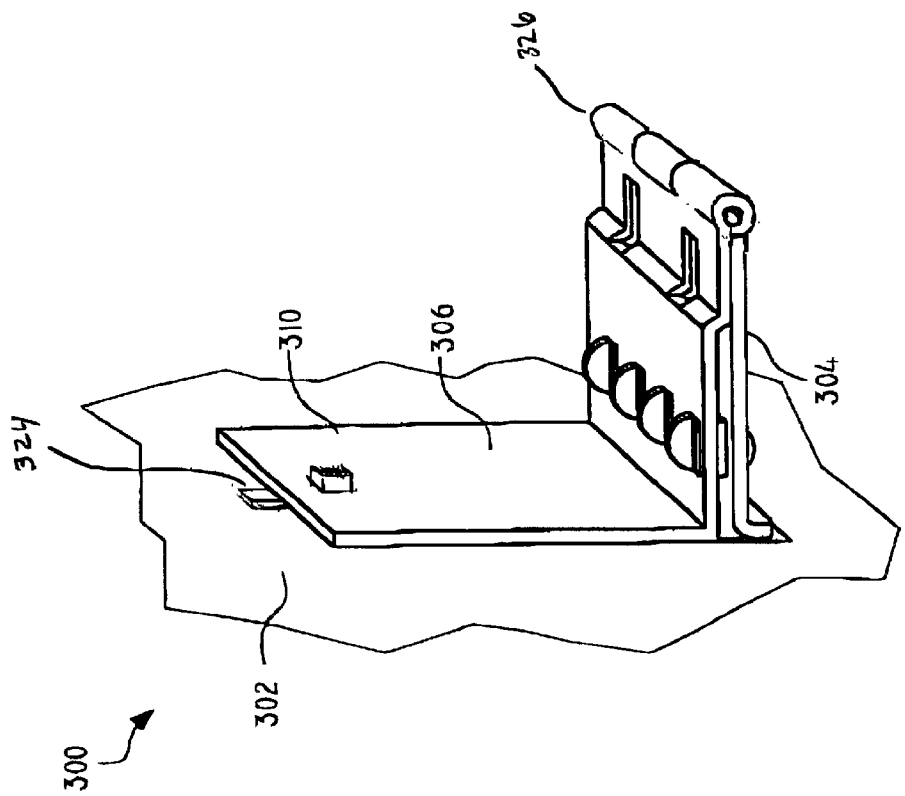
FIG. 3 is a perspective illustration of an exemplary embodiment wherein an apparatus suitable for receiving a tab included on a printed circuit board (PCB) includes a securing member in a secured orientation.
Figure 2:
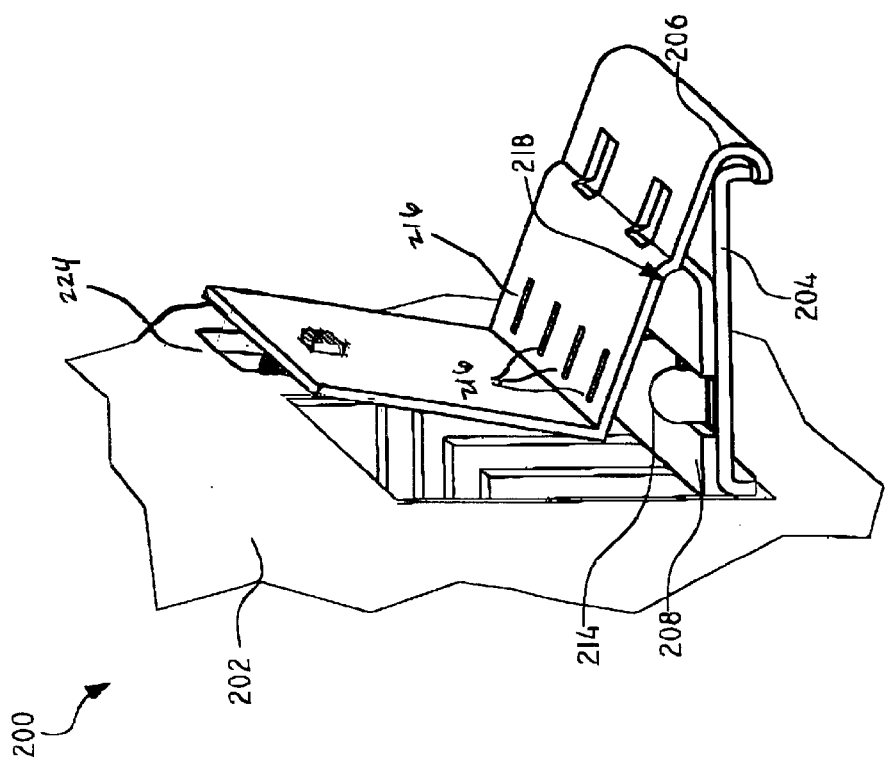
FIG. 2 is a perspective illustration of an exemplary embodiment wherein the securing member includes and angled receiving area capable of forcing a received tab inwardly to the chassis.

Referring generally now to FIGS. 1 through 3, exemplary embodiments of the present invention are shown, wherein an apparatus is suitable for receiving a tab included on a printed circuit board (PCB). Tabs included on a PCBs generally are the extension portion of a L-shaped bracket attached to the PCB for securing the PCB to a chassis of an information handling system or the like. PCB include peripheral component interface cards (PCI), device cards, and the like standard to the industry.

Referring now to FIG. 1, an apparatus 100 is shown. The apparatus 100 of the present invention offers the ability to secure a tab 108 included on a PCB in an efficient manner while ensuring proper connection to an electrical component, such as a motherboard of an information handling system.

In a first embodiment of the present invention, the apparatus 100 includes a chassis 102 suitable for housing an electrical component. For instance, the chassis may be configured for an information handling system. Disposed on the external surface of the chassis 102 is a card retention member 104. In embodiments the card retention member is proximal to an aperture through which the tabbed extension of a device card protrudes. The card retention member 104 may be suitable for receiving a tab 108 included on a PCB. The tab 108 included on the PCB is an extension portion of a hold down bracket attached to the PCB and is designed to retain the PCB to a chassis, such as the chassis of the present invention. It is to be understood that various configurations of PCB tabs, such as an extension portion of a standard PCI card, device cards and the like typical to the industry are contemplated and it is the intention of this invention to encompass an apparatus suitable for receiving such tabs.

Pivotally attached to the card retention member 104 is a securing member 106. The securing member 106 may be capable of pivoting about a hinge attaching the securing member 106 to the card retention member 104. Furthermore, the pivoting attachment of the securing member 106 may be disposed perpendicularly to the received tab 108 included on a PCB to allow for ease of operation and secure retention of the tab 108.

In a further example, the pivotal attachment is formed from the card retention member 104 and the securing member 106. The respective ends of the card retention member 104 and the securing member 106 being shaped so as to interlock and effectively form a pseudo hinge device. For example in a pseudo hinge device portions of the card retention member and the securing member are cut and shaped to interlock so as to form a hinge device.

The securing member 106 pivoting about the attachment may be capable of attaining a releasing orientation and a securing orientation. The motion of the securing member being capable of effectively sandwiching the received tab 108 between the securing member 106 and the card retention member 104. Thus forming a securing orientation, as seen in FIG. 3. A releasing orientation, as seen in FIG. 1, may be achieved by pivoting the securing member 106 away from the external surface of the chassis 102 allowing for removal of the tab 108 from the apparatus 100.

In a further embodiment, the apparatus 100 may include a locking system. The locking system may restrain the securing member 106 from obtaining the releasing orientation. In one example, the locking system includes a threaded screw 110 suitable for engaging the chassis including a threaded hole 112. In additional examples the locking system may be a slide lock, a snap-latch, and the like for restraining the securing member 106.

At least one of the chassis 102 the card retention member 104 and the securing member 106, may include a plurality of extensions 114. The plurality of extensions 114 being suitable for securing the received tab included on the PCB from movement in a direction parallel to the securing member's pivotal axis, effectively limiting lateral movement of the tab extension. For example, the plurality of extensions 114 may be located so that the plurality of extensions 114 pass through cutouts included in the tab included on a PCB. Furthermore, the extensions may aid in the alignment of the received tab 108 during installation.

As best seen in FIG. 2, at least one of the card retention member 204 and the securing member 206, may include a plurality of slots 216 for receiving the plurality of extensions 214. In an alternative embodiment, at least one of the card retention member 204 and the securing member 206, may include a plurality of recesses for receiving the plurality of extensions 214. The plurality of slots 216 or the plurality of recesses, in alternative embodiments being suitable for additionally securing the plurality of extensions 214 from movement with respect to the securing member 206 and the card retaining member 204.

In a further example, the plurality of extensions 214 may include a wedge shape so a to contact the plurality of slots 216 to form a friction latch for restraining the securing member 206 to the card retention member 204.

With reference to FIG. 2, the securing member 206 may include an angled receiving area 218 capable of forcing the received tab 208 included on a PCB inward to a chassis 202. The securing member 206 including an angled receiving area 218 may additionally secure the PCB into electronic components included in the chassis 202. For example, the angled receiving area 218 of the securing member 206 may force the PCB into a connector located on the motherboard of an information handling system. The angled receiving area 218 may additionally maintain pressure on the tab 208 while retained by a locking system. In an embodiment, the angled receiving area 218 of the securing member 206 may force a tab 208 included on a PCB inwardly from 0.0 mm to 0.5 mm so as to ensure proper connection to electronic components.

Referring to FIG. 3, the securing member 306 of apparatus 300 may obtain a secured orientation such that a received tab included on a PCI type card may be immobilized from shock, vibration, and the like. A threaded screw 310, such as a thumbscrew, included in a locking system may restrain the securing member from achieving a release orientation by interlocking with threads located in a hole included in a chassis 302 and maintain inward pressure towards the chassis 302.

In further examples, the apparatus 300 may be constructed from material capable of shielding internal electrical components from electromagnetic interference as well as electromagnetic grounding. The securing member 306 in the secured orientation may serve the additional function of preventing the ingress of contaminates into the chassis 302.

It is believed that the pivoting pressure cover of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof It is the intention of the following claims to encompass and include such changes.

What is claimed is:

1. An apparatus comprising:
   a chassis including an external surface, the chassis suitable for including an electrical component;
   a card retention member disposed on the external surface of the chassis, wherein the card retention member is suitable for receiving a tab included on a printed circuit board for retaining the printed circuit board in the chassis; and
   a securing member pivotally attached to the card retention member, wherein the securing member is capable of attaining a releasing orientation and a suitable orientation for securing the printed circuit board to the chassis;
   wherein at least one of the chassis, the card retention member and the securing member include a plurality of extensions, wherein the plurality of extensions are suitable for securing the received tab from movement parallel to the securing member's pivotal attachment; and
   wherein at least another one of the securing member and the receiving member include a plurality of slots for receiving the plurality of extensions.

2. The apparatus of claim 1, further comprising a locking system wherein the locking system is capable of restraining the securing member from attaining the releasing orientation.

3. The apparatus as claimed in claim 2, wherein the locking system is at least one of a screw, a slide-lock, and a snap-latch.

4. The apparatus of claim 1, wherein at least one of the chassis, the card retention member and the securing member include a plurality of extensions, wherein the plurality of extensions are suitable for securing the received tab from movement in a direction in a plane parallel to the securing member.

5. The apparatus as claimed in claim 4, wherein at least one of the securing member and the receiving member include a plurality of recess for receiving the plurality of extensions.

6. The apparatus of claim 1, wherein the plurality or extension are wedge shaped to form a friction latch with the plurality of slots to restrain the securing member to the card retention member.

7. The apparatus of claim 1, wherein the securing member includes an angled receiving area for forcing the received tab inwardly to the chassis.

8. The apparatus as claimed in claim 6, wherein the securing member forces the received tab inwardly to the chassis from 0.0 millimeters to 0.5 millimeters.

9. The apparatus as claimed in claim 1, wherein the securing member's pivotal axis is perpendicular to the direction of the received tab.

10. The apparatus of claim 1, wherein the securing member's pivotal axis is attached to the retention member opposite the external surface of the chassis.

11. The apparatus of claim 1, wherein the securing device encloses the chassis from external contaminates.

12. The apparatus of claim 1, wherein the apparatus is constructed from electromagnetic grounding material.

13. The apparatus as claimed in claim 1, wherein the securing member's pivotal attachment is at least one of a hinge and a pseudo hinge device.

14. A pivoting printed circuit board cover for an information handling system, comprising:
   a chassis including an external surface, the chassis suitable for including an electrical component;
   a card retention member disposed on the external surface of the chassis, wherein the card retention member is suitable for receiving a tab included on a printed circuit board for retaining the printed circuit board in the chassis; and
   a securing member pivotally attached to the card retention member, wherein the securing member is capable of attaining a releasing orientation and a suitable orientation for securing the printed circuit board to the chassis and a connector on a motherboard;
   wherein at least one of the chassis, the card retention member and the securing member include a plurality of extensions suitable for securing the received tab from movement parallel to the securing member's pivotal attachment; and
   wherein at least one of the securing member and the receiving member include a plurality of slots for receiving the plurality of extensions.

15. The apparatus of claim 14, further comprising a locking system wherein the locking system is capable of restraining the securing member from attaining the releasing orientation.

16. The apparatus as claimed in claim 14, wherein the locking system is at least one of a screw, a slide-lock, and a snap-latch.

17. The apparatus of claim 14, wherein at least one of the chassis, the card retention member and the securing member include a plurality of extensions suitable for securing the received tab from movement in a direction in a plane parallel to the securing member.

18. The apparatus as claimed in claim 17, wherein at least one of the securing member and the receiving member include a plurality of recess for receiving the plurality of extensions.

19. The apparatus of claim 14, wherein the plurality of extensions are wedge shaped to form a friction latch with the plurality of slots to restrain the securing member to the card retention member.

20. The apparatus of claim 14, wherein the securing member includes an angled receiving area for forcing the received tab inwardly to the chassis.

21. The apparatus as claimed in claim 20, wherein the securing member forces the received tab inwardly to the chassis from 0.0 millimeters to 0.5 millimeters.

22. The apparatus as claimed in claim 14, wherein the securing member's pivotal axis is perpendicular to the direction of the received tab.

23. The apparatus of claim 14, wherein the securing device encloses the chassis from external contaminates.

24. The apparatus of claim 14, wherein the apparatus is constructed from electromagnetic grounding material.

25. An apparatus comprising:
   means for housing a device card, the device card including a tab extension, said housing means having an aperture through which the tab protrudes when the device card is housed in said housing means;
   means for receiving the tab extension of the device card when the device card is disposed in said housing means, said receiving means being disposed exteriorly to said housing means proximal to the aperture;
   means for securing the device card against said receiving means, said securing means securing the extension of the device card against said receiving means; and
   retaining means, included as part of said receiving means, for reducing lateral movement of the device card when the device card is disposed within said housing means, said securing means having at least one or more apertures for engaging with said retaining means when said securing means is disposed in an engagement position.

26. An apparatus as claimed in claim 25, further comprising means for pivoting said securing means about an axis wherein said securing means pivots about the axis to move into an engagement position for securing the tab extension of the device card against said receiving means, and pivots about the axis away from the engagement position to allow insertion or removal of a device card within said housing means.

27. An apparatus as claimed in claim 25, further comprising means for pivoting said securing means about an axis wherein said securing means pivots about the axis to move into an engagement position for securing the tab extension of the device card against said receiving means, and pivots about the axis away from the engagement position to allow insertion or removal of a device card within said housing means, and further comprising means for fastening said securing means when said securing means is disposed in the engagement position.

28. An apparatus as claimed in claim 25, said receiving means including retaining means for reducing lateral movement of the device card when the device card is disposed within said housing means.

29. An apparatus as claimed in claim 25, wherein said securing means secures the device card within said housing means without using a fastener directly coupled to the hold down bracket of the device card.

30. An apparatus as claimed in claim 25, wherein multiple device cards may be removably secured within said housing using a number of fasteners that is less than or equal to a number of device cards capable of being housed within said housing means.

* * * * *